(12) United States Patent
Iliopoulos et al.

(10) Patent No.: US 10,002,748 B2
(45) Date of Patent: Jun. 19, 2018

(54) DETECTION OF GROUNDING STRAP BREAKAGE

(71) Applicant: Applied Materials, Inc., Santa Clara, CA (US)

(72) Inventors: Ilias Iliopoulos, Foster City, CA (US); Shuo Na, Sunnyvale, CA (US); Kelby Yancy, Forney, TX (US); Chunsheng Chen, Tianjin (CN)

(73) Assignee: Applied Materials, Inc., Santa Clara, CA (US)

(*) Notice: Subject to any disclaimer, the term of this patent is extended or adjusted under 35 U.S.C. 154(b) by 666 days.

(21) Appl. No.: 14/610,572

(22) Filed: Jan. 30, 2015

(65) Prior Publication Data

US 2015/0221484 A1    Aug. 6, 2015

Related U.S. Application Data

(60) Provisional application No. 61/935,837, filed on Feb. 4, 2014.

(51) Int. Cl.
| | |
|---|---|
| *G06F 11/30* | (2006.01) |
| *H01J 37/32* | (2006.01) |
| *C23C 16/52* | (2006.01) |
| *C23C 16/505* | (2006.01) |
| *G21C 17/00* | (2006.01) |

(52) U.S. Cl.
CPC ...... *H01J 37/32935* (2013.01); *C23C 16/505* (2013.01); *C23C 16/52* (2013.01); *H01J 37/3299* (2013.01); *H01J 37/32174* (2013.01); *H01J 37/32944* (2013.01)

(58) Field of Classification Search
CPC .................................................. C23C 16/505
See application file for complete search history.

(56) References Cited

U.S. PATENT DOCUMENTS

2013/0071581 A1* 3/2013 Baek ........................ H05H 1/46
427/569

* cited by examiner

*Primary Examiner* — Phuong Huynh
(74) *Attorney, Agent, or Firm* — Patterson + Sheridan, LLP

(57) ABSTRACT

The present invention generally relates to a method for detecting the breakage of one or more grounding straps without stopping processing or opening the processing chamber for inspection. In one embodiment, a method for detecting grounding strap breakage in a processing chamber includes monitoring real-time RF related data from plasma generated in the processing chamber. The method also includes comparing the real-time RF related data with a pre-determined threshold RF related data. The method includes generating an alert if the real-time RF related data meets or exceeds the pre-determined threshold RF related data. In one embodiment, the RF related data includes RF frequency, direct current voltage, voltage peak-to-peak, and/or RF reflected power.

20 Claims, 2 Drawing Sheets

DETECTION OF GROUNDING STRAP BREAKAGE

CROSS-REFERENCE TO RELATED APPLICATIONS

This application claims priority to U.S. Provisional Patent Application Ser. No. 61/935,837, filed on Feb. 4, 2014, which herein is incorporated by reference.

BACKGROUND

Field of the Invention

Embodiments of the invention generally relate to a plasma processing chamber having a RF return path with low impedance and the method for using the same.

Description of the Related Art

Liquid crystal displays (LCDs) or flat panels are commonly used for active matrix displays such as computers, touch panel devices, personal digital assistances (PDAs), cell phones, television monitors, and the like. Further, organic light emitting diodes (OLEDs) have also been widely used for flat panel displays. Generally, flat panels comprise two plates having a layer of liquid crystal material sandwiched therebetween. At least one of the plates includes at least one conductive film disposed thereon that is coupled to a power source. Power, supplied to the conductive film from the power supply, changes the orientation of the crystal material, creating a patterned display.

In order to manufacture these displays, a substrate, such as a glass or polymer workpiece, is typically subjected to a plurality of sequential processes to create devices, conductors and insulators on the substrate. Each of these processes is generally performed in a process chamber configured to perform a single step of the production process. In order to efficiently complete the entire sequence of processing steps, a number of process chambers are typically coupled to a transfer chamber that houses a robot to facilitate transfer of the substrate between the process chambers. One example of a processing platform having this configuration is generally known as a cluster tool, examples of which are the families of plasma enhanced chemical vapor deposition (PECVD) processing platforms available from AKT, a division of Applied Materials, Inc., of Santa Clara, Calif.

As demand for flat panels has increased, so has the demand for larger sized substrates. For example, large area substrates utilized for flat panel fabrication have increased in area from 550 mm by 650 mm to over 4 square meters in just a few years and are envisioned to continue to increase in size in the near future. This growth in the size of the large area substrates has presented new challenges in handling and production. For example, the larger surface area of the substrates requires increased grounding capacity of the substrate supports.

On conventional PECVD systems, a plurality of flexible conductive straps provides a ground path between the substrate support and chamber body. The grounding straps prevent RF arcing at the side of the substrate support, thereby preventing a secondary plasma from forming at the sides of the substrate support. Grounding straps are generally fabricated from aluminum sheets with a top portion of the grounding strap connected to the substrate support, and a bottom portion of the grounding strap connected to a chamber body wall. As the substrate support moves up and down, coupled with high processing temperatures (e.g., greater than 300 degrees Celsius), the aluminum grounding straps weaken due to thermal stress and eventually break.

Since the grounding straps are not readily visible from the exterior of the processing chamber, operators are often unaware if the grounding straps are broken unless they stop processing and perform a visual inspection with a light source or physically open the processing chamber. Broken grounding straps may adversely affect the RF ground return path in the processing chamber, which results in defects and non-uniformity on the substrate.

Therefore, there is a need for an improved method of detecting grounding strap breakage without stopping processing or having to open the processing chamber.

SUMMARY

The embodiments generally relate to a method for detecting the breakage of one or more grounding straps, which couple a substrate support to a plasma processing chamber body, without stopping a plasma process being performed in the plasma processing chamber and/or opening the plasma processing chamber after plasma processing. An apparatus and method are also disclosed herein that can be used to alert an end user that one or more of the grounding straps are broken.

In one embodiment, a method for detecting grounding strap breakage in a processing chamber includes monitoring real-time RF generated data created while a plasma is formed in the processing chamber. The method also includes comparing the real-time RF generated data with a pre-determined threshold plasma processing characteristic, such as measured RF related data. The method includes generating an alert if the measured real-time RF related data meets or exceeds the pre-determined threshold plasma processing characteristic (e.g., RF power delivery related data). The RF related data may include RF frequency, direct current (DC) voltage, peak-to-peak voltage, and/or RF reflected power.

In another embodiment, a computer-readable medium is disclosed that includes instructions that enable a processing unit to implement one or more aspects of the disclosed method for detecting ground strap breakage. The method includes monitoring real-time RF generated data created while a plasma is formed in the processing chamber. The method also includes comparing the real-time RF generated data with a pre-determined threshold plasma processing characteristic, such as measured RF related data. The method includes generating an alert if the measured real-time RF related data meets or exceeds the pre-determined threshold plasma processing characteristic (e.g., RF power delivery related data). The RF related data may include RF frequency, direct current (DC) voltage, peak-to-peak voltage, and/or RF reflected power.

In yet another embodiment, a system is disclosed having a processor, memory, and application programs configured to implement one or more aspects of the disclosed method for detecting grounding strap breakage in a processing chamber. The system includes a processor and a plasma processing chamber. The plasma processing chamber includes a plurality of chamber walls that at least partially define a processing region and a substrate support disposed within the processing region. The plasma processing chamber also includes a plurality of ground straps that each have a strap body that has a first end and a second. The first end of each of the plurality of ground straps is coupled to the substrate support and the second end of each of the plurality of ground straps is coupled to at least one of the plurality of chamber walls. The plasma processing chamber includes an RF power source and an RF match coupled between the RF power source and a diffuser. The RF match, the RF power source and/or the diffuser are adapted to generate a plasma in the process volume when RF energy is delivered to the diffuser from the RF power source. The RF match further includes one or more sensors that are configured to provide real-time RF related data to the processor when the RF energy is delivered from the RF power source. The system also includes a memory. The memory includes a software routine configured to perform an operation for detecting breakage of one or more of the plurality of ground straps in a processing chamber. The operation of the software routine includes monitoring real-time RF related data from plasma generated in the processing region of the processing chamber. The operation also includes comparing the real-time RF related data with a pre-determined threshold RF related data and generating an alert if the real-time RF related data meets or exceeds the pre-determined threshold RF related data.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments presented herein relate to a method for detecting the breakage of one or more grounding straps in a plasma processing chamber. The grounding straps are coupled to a substrate support and/or substrate supporting components disposed in a plasma processing chamber. The breakage of the grounding straps may be detected while a plasma process is being performed in the plasma processing chamber without opening the processing chamber. Also, by use of one or more of the methods described herein, a user may be alerted that one or more of the grounding straps have become damaged or broken.

Embodiments herein are illustratively described below in reference to a PECVD system configured to process large area substrates, such as a PECVD system, available from the AKT division of Applied Materials, Inc., Santa Clara, Calif. However, it should be understood that the invention may have utility in other plasma processing chambers where it is desirable to ensure that one or more ground paths remain functioning at a level that facilitates acceptable processing within the chamber. It is contemplated that other deposition chambers, including those from other manufacturers, may be utilized to practice the present invention.

Figure 1:
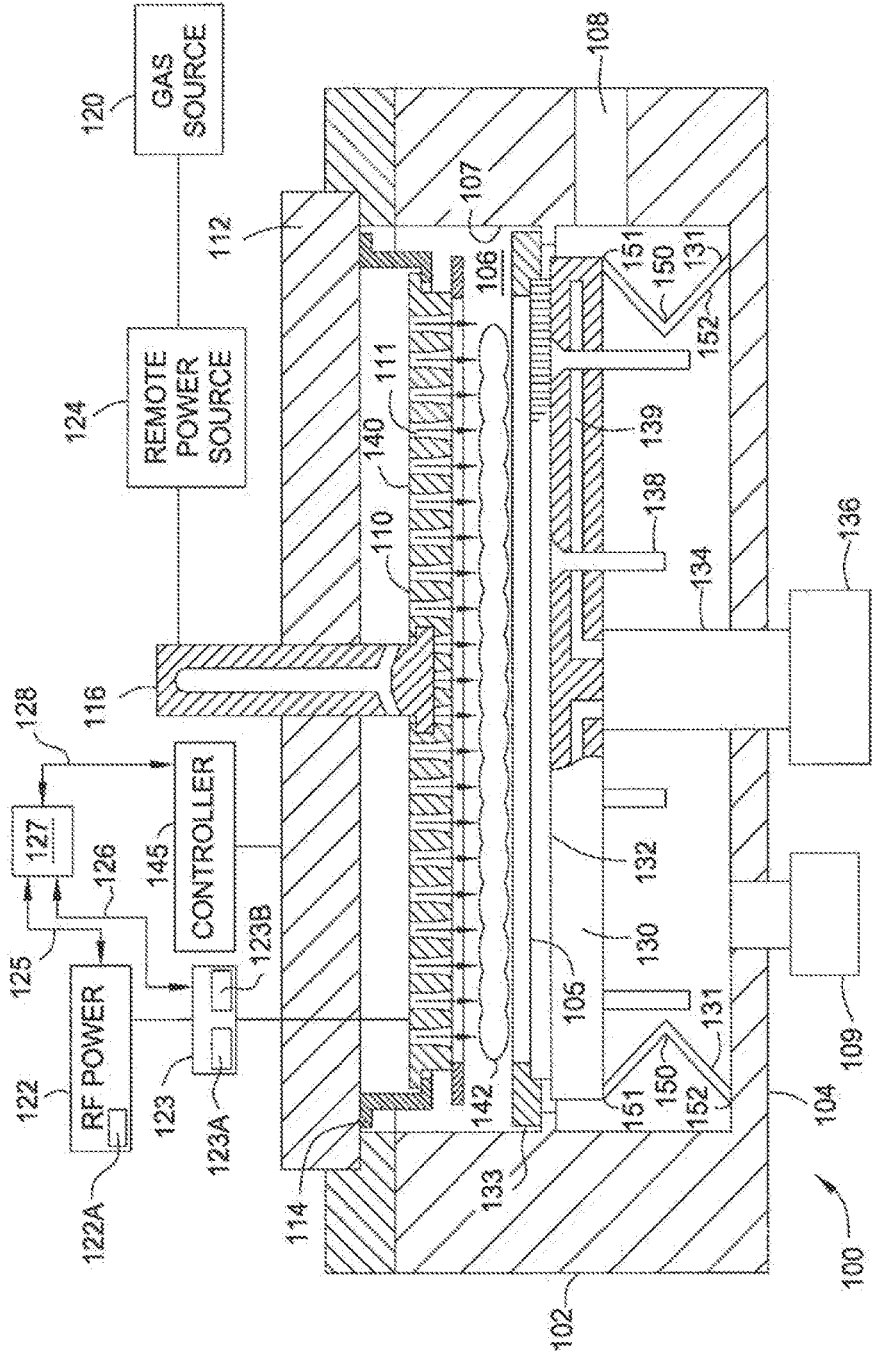
FIG. 1 is a schematic cross-section view of one embodiment of a PECVD chamber.

FIG. 1 is a schematic cross-section view of one embodiment of a PECVD chamber 100 for forming electronic devices, such as thin film transistors and active-matrix organic light-emitting diodes. FIG. 1 is an example of an apparatus that may be used to form electronic devices on a substrate.

The chamber 100 generally includes walls 102, a bottom 104, and a gas distribution plate or diffuser 110, and substrate support 130, which define a process volume 106. The process volume 106 is accessed through a sealable slit valve 108 formed through the walls 102, such that a substrate 105, may be transferred in and out of the chamber 100. The substrate support 130 includes a substrate receiving surface 132 for supporting the substrate 105 and a stem 134 coupled to a lift system 136 to raise and lower the substrate support 130. A shadow frame 133 may be placed over periphery of the substrate 105 during processing. The shadow frame 133 is configured to prevent or reduce unwanted deposition from occurring on surfaces of the substrate support 130 that are not covered by the substrate 105 during processing. Lift pins 138 are moveably disposed through the substrate support 130 to move the substrate 105 to and from the substrate receiving surface 132 to facilitate substrate transfer.

The substrate support 130 may also include heating and/or cooling elements 139 to maintain the substrate support 130 and substrate 105 positioned thereon at a desired temperature. In one embodiment, the heating and/or cooling elements 139 may be utilized to maintain the temperature of the substrate support 130 and substrate 105 disposed thereon during processing to less than about 400° C. or less. In one embodiment, the heating and/or cooling elements 139 may be used to control the substrate temperature to less than 100° C., such as between 20° C. and about 90° C.

The substrate support 130 includes one or more grounding straps 131 to ground portions of the substrate support during plasma processing and it is believed to minimize or prevent plasma and/or RF arcing at the sides of the substrate support 130. In one embodiment, the grounding straps 131 are fabricated from a metal, such as aluminum, copper or other useful metal. The plurality of ground straps 131 each have a body 150 that has a first end 151 and a second end 152. The first end 151 of each of the plurality of ground straps is coupled to the substrate support 130. The second end 152 of each of the plurality of grounding straps 131 is coupled to at least one of the plurality of walls, such as side walls 102 and/or the bottom 104, of the chamber 100.

The diffuser 110 is coupled to a backing plate 112 at its periphery by a suspension 114. The diffuser 110 may also be coupled to the backing plate 112 by one or more center supports 116 to help prevent sag and/or control the straightness/curvature of the diffuser 110. A gas source 120 is coupled to the backing plate 112 to provide one or more gases through the backing plate 112 to a plurality of gas passages 111 formed in the diffuser 110 and to the substrate receiving surface 132. A vacuum pump 109 is coupled to the chamber 100 to control the pressure within the process volume 106.

The spacing between a top surface of the substrate 105 disposed on the substrate receiving surface 132 and a bottom surface 140 of the diffuser 110 during processing may be between about 400 mil ($10^{-3}$ inches) and about 1,200 mil, for example between about 400 mil and about 800 mil. In one embodiment, the bottom surface 140 of the diffuser 110 may include a concave curvature wherein the center region is thinner than a peripheral region thereof.

A remote plasma source 144, such as an inductively coupled remote plasma source, may also be coupled between the gas source 120 and the backing plate 112. Between substrate processing steps, a cleaning gas may be provided to the remote plasma source 144 and excited to form a remote plasma from which dissociated cleaning gas species are generated and provided to clean the chamber components disposed within the chamber 100. The cleaning gas may be further excited by delivering energy from the RF power source 122, which is coupled to the diffuser 110, to enhance the formation of energetic and/or dissociated cleaning gas species.

A controller 145 may be coupled to the chamber 100 to control and/or monitor processing parameters within the chamber 100. In one embodiment, the controller 145 is configured to monitor the processing conditions within the chamber. In some cases, the controller is configured to monitor the characteristics of the plasma formed in the plasma processing chamber. The controller 145 may include a central processing unit (CPU), a memory, and support circuits for the CPU that is coupled to the various components of the chamber 100 to facilitate control and monitoring of the processes performed therein. The controller 145 may be one of any form of general purpose computer processor that can be used in an industrial setting for controlling various chambers and subprocessors. The memory, or computer-readable medium, may be one or more of readily available memory such as random access memory (RAM), read only memory (ROM), floppy disk, hard disk, or any other form of digital storage, local or remote that is in communication with the CPU. The memory may include a software routine configured to perform an operation for detecting breakage of one or more of the plurality of ground straps 131 in the chamber 100. The support circuits are in communication with the CPU for supporting the processor in a conventional manner. These circuits include cache, power supplies, clock circuits, input/output circuitry and subsystems, and the like. Processing recipes and transfer routines as well as metrics indicative of the plasma parameters, such as described herein, is generally stored in the memory as a software routine. The software routine may also be stored and/or executed by a second CPU that is remotely located from the hardware being controlled by the CPU.

As will be appreciated by one of ordinary skill in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized for storing a program product which, when executed, is configured to perform method for detecting the breakage or damage to the ground straps 131 and/or scheduling a preventative maintenance event. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as JAVA™, SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In some embodiments, an RF power source 122 is coupled to the backing plate 112 and/or to the diffuser 110 through an RF connection 124. During processing, the RF power source 122 is generally configured to provide RF power to the diffuser 110 to generate a plasma 142 between the diffuser 110 and the substrate support 130 when a gas is present therebetween. The RF power source 122 may be able to deliver the RF power at an RF frequency between about 0.3 MHz and about 200 MHz. In one embodiment, the RF power source 122 provides power to the diffuser 110 at a frequency of 13.56 MHz. In some embodiments, the RF power source 122 may also include at least one sensor 122A that is able to detect at least one characteristic of the RF power delivered by the RF power source 122 to the diffuser 110 through the RF connection 124.

A PC tool 127 may have a bidirectional connection 128 to communicate with the controller 145. The PC tool 127 may provide collect data from internal and external sensors, such as sensor 122A, and provide feedback to the controller 145. The PC tool 127 may be similarly configured to the controller 145 and have a CPU, memory, among other enabling hardware and software. The PC tool 127 may be a provided in a circuit board, PLC or other device. Alternately, the PC tool 127 may be integrated with, as hardware and/or software, as part of the controller 145.

In one example, the sensors 122A may be configured to measure the power, current and/or applied voltage during processing and deliver the collected data to the PC tool 127 via a connection 125. In another example, the sensors 122A are configured to detect the total current or the real part of the current (product of total current and cosine of impedance angle, or quotient of absorbed bias power with respect to bias voltage, for example) directly or indirectly by calculation from indirect measurements. In some configurations, the measured current may be the RMS (root means squared) current, and/or the peak current or the peak-to-peak current provided during plasma processing.

In some embodiments of the chamber 100, an RF match 123 is provided to assure that a maximum amount of power is transferred to the plasma 142 from the RF power source 122, and to protect the power delivery components (e.g., RF power source 122) from being damaged due to a high reflected power created when the RF power is non-optimally provided at a frequency that is not at resonance. In this configuration, the RF power source 122 is coupled into the plasma 142 that is present in the chamber 100 through an RF match 123, which includes a RF match circuit 123A that contains variable reactance elements. The purpose of the RF match circuit 123A is to transform the impedance of the load to a value that equals or matches the characteristic impedance of the RF connection through which the RF power is delivered to the chamber 100. At the match point, optimum power is delivered into the plasma 142 and little power is reflected back toward the RF power source 122. Tuning to the match point is accomplished by appropriately varying the output RF power frequency and/or varying the variable reactance element values within the RF match circuit 123A.

The RF match circuit 123A is typically controlled by a detector circuit 123B that includes various variable reactance elements in which reactance is controlled by one or more control signals that are created by sensors (not shown) found in the detector circuit 123B. The detector circuit 123B may be connected to the cathode and anode of the process chamber 100. The detector circuit 123B may include one or more sensors that are adapted to measure the amount of RF power delivered to the plasma (e.g., forward signal) and the amount of reflected power (e.g., reflected signal). The sensors may also be configured to detect the actual variable reactance values and/or desired settings of the various variable reactance elements (e.g., inductive and/or capacitive elements) used by the RF match 123 during processing. One or more sensors may also be coupled to a portion of the RF connection to detect the RF characteristics of the RF power delivered through the RF match 123 during processing. The detector circuit 123B may be configured to provide information about the RF power being delivered to the plasma 142 and/or characteristics of the matching parameters (e.g., variable reactance settings, RF frequency), used by the RF match circuit 123A to tune the delivered RF power to the match point, to the PC tool 127 via the connection 126.

The controller 145 compiles the information gathered by the PC tool 127 and can be configured to use the input data received from the sensors in the detector circuit 123B and/or the information received from the sensors 122A in the RF power source 122 to determine if the RF power delivery characteristics to the chamber 100 has changed during a single substrate plasma process (e.g., during at least one step during the processing of one substrate) or whether the RF power delivery characteristics has changed from one substrate plasma process to the next substrate plasma process. In one embodiment, the PC tool 127 monitors RF related data, such as RF frequency, direct current voltage (Vdc), voltage peak-to-peak (Vpp), and RF reflected power, and other properties of the applied RF power during processing of a substrate 105. The RF related data may be monitored real-time from the plasma 142 generated in the process volume 106. The PC tool 127 provides the sensor data to the controller 145. The controller 145 may include a database with configurable software modules having sensors that monitor the RF input signals received by the PC tool 127 from the sensors to track RF parameters within the processing chamber 100. In one embodiment, the controller 145 may be an automation and equipment engineering system (EES) platform sold by Applied Materials, Inc. as the Applied E3 module, although suitably adapted controllers from other manufacturers could be used.

In one embodiment, the controller 145 uses historical RF data (obtained using a manufacturer's particular recipe for a desired product) that was detected by sensors in the detector circuit 123B and/or the sensors 122A as a pre-determined baseline. The baseline is indicative of a time when it is known that the grounding straps 131 are connected and are functioning properly. The controller 145 can then use the collected historical data and store it in memory so that it can then be subsequently used as limits, or threshold, such that RF parameters outside of those thresholds represents grounding strap breakage, grounding strap damage (such as cracking which leads to a higher electrical resistance for the RF current path to ground), or other indicator that the life of the grounding strap is at or near its end. The controller 145 provides the ability to monitor, in real-time, RF related data items such as RF frequency, RF reflected power, Vdc, and/or Vpp, along with any desired chamber parameter. In one embodiment, the changes in RF related data may indicate changes in local plasma impedance created by the breakage of one or more grounding straps 131, which is recognized by the user by noting a shift in the process uniformity (e.g., deposition uniformity data) which is collected by ex-situ process measurement techniques (e.g., Rs map data). Therefore, by noting the variation in process uniformity the user can determine that one or more grounding straps 131 have become damaged (e.g., higher electrical resistance) or broken. Alternately, changes in local plasma impedance can also be detected by use of one or more plasma property sensors (e.g., Langmuir probes) distributed around the chamber that are able to sense properties of the plasma 142 and deliver the plasma property information to the controller 145.

Alternately, using real-time data mining of presently monitored RF related data, the controller 145 compares the presently monitored RF related data against signatures of grounding straps in a predetermined condition (i.e., broken, worn, damaged, near end of life, etc.) which is indicative of broken, damaged, or worn grounding straps from the historical RF data (i.e., a pre-determined number of non-broken grounding straps in acceptable condition to that of no broken grounding straps in acceptable condition for the whole recipe). Therefore, the RF related data parameters, such as the match point settings in the RF match 123 and/or variations in the forward and reflected power can be used as reliable indicators to determine when one or more broken or damaged grounding straps 131 are present within the processing chamber. It is believed that the change in the collected RF data over time may be caused by the change in the electrical characteristics of the RF return path in the processing chamber, due to presence of broken or damaged grounding straps 131, which affects at least one of the RF delivery parameters (e.g., measured match point, reflected power level, match point settings of the reactive elements, etc.). In some cases, trends in the collected RF data can be used to determine that the grounding straps are nearing the end of their service life so that preventative maintenance may be performed. Once the real-time RF related data parameters meet or exceed the baseline limits, which represents an unacceptable grounding strap condition, the controller 145 sends an alert or notification that an unacceptable threshold has been reached.

Figure 2:
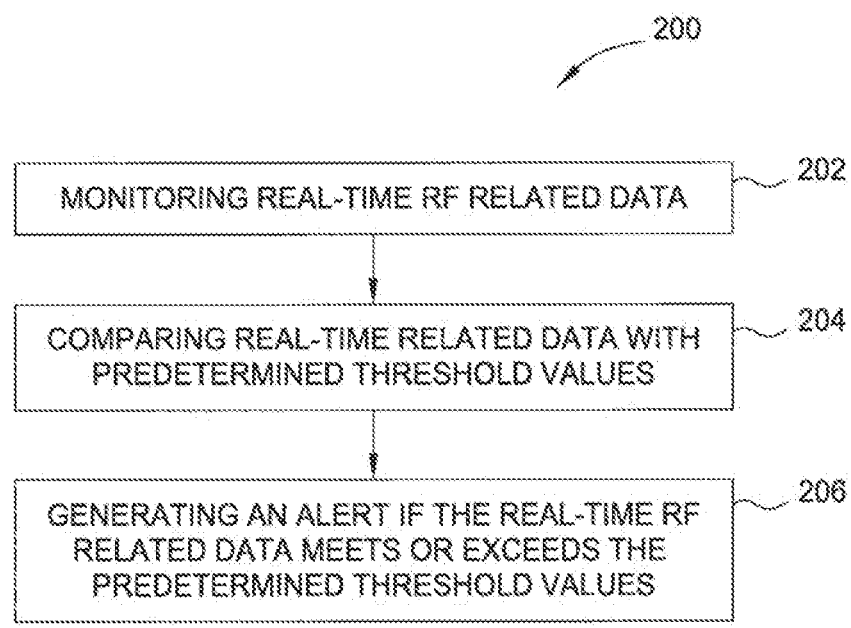
FIG. 2 is a flow diagram of a method of detecting ground strap breakage.

FIG. 2 is a flow diagram for a method 200 for detecting the breakage of one or more of the grounding straps 131. The method 200 begins at block 202 by monitoring real-time RF related data of a processing recipe performed in the processing chamber 100 having one or more of the grounding straps 131. At block 202, the real-time RF related data is compared to a pre-determined threshold of unacceptable RF related data values (i.e., data mining). In one embodiment, the pre-determined threshold of unacceptable RF related data values are based on historical RF data reflecting a certain number of broken ground straps. At block 204, a real-time alert is generated if the real-time RF related data meets or exceeds the pre-determined threshold of unacceptable RF related data values.

Thus, a method for detecting the breakage of one or more of the grounding straps is provided. Advantageously, the above recited method saves an end user time and expenses associated with preemptively stopping a process recipe and manually checking for broken grounding straps by either opening the processing chamber or using man-power to visually inspect the grounding straps. Additionally, the real-time alert allows an end user to stop processing only when necessary and prevent additional substrates from being processed at unacceptable RF data values (i.e., processing with an undesired number of broken grounding straps). Since conventional fabrication assemblies only test substrates periodically, the above recited method for detecting grounding strap breakage early increases substrate throughput and prevents costly scrap.

While the foregoing is directed to the preferred embodiment of the present invention, other and further embodiments of the invention may be devised without departing from the basic scope thereof, and the scope thereof is determined by the claims that follow.

What is claimed is:

1. A method for detecting grounding strap breakage in a processing chamber, comprising:
    monitoring real-time RF related data corresponding to plasma generated in the processing chamber;
    comparing the real-time RF related data with a pre-determined threshold RF related data;
    determining the real-time RF related data indicates a worn or damaged state for one or more grounding straps prior to breakage based on comparing the real-time RF related data with the pre-determined threshold RF related data; and
    generating an alert in response to determining the real-time RF related data indicates a worn or damaged state for one or more grounding straps.

2. The method of claim 1, wherein the real-time RF related data includes RF frequency, direct current voltage, voltage peak-to-peak, and/or RF reflected power.

3. The method of claim 1, wherein the pre-determined threshold RF related data is based on RF frequency, direct current voltage, voltage peak-to-peak, or RF reflected power reflecting one or more broken grounding straps in a process recipe matching a current process recipe.

4. The method of claim 1, wherein the comparing the real-time RF related data comprises:
    using historical RF data for a particular recipe for a desired product to establish the pre-determined threshold RF related data.

5. The method of claim 4, wherein the pre-determined threshold RF related data is based on historical RF data reflecting a certain number of broken grounding straps.

6. The method of claim 4, further comprising:
    determining the trend in RF data indicative of grounding straps approaching end of service life; and
    generating the alert when grounding straps are nearing the end of service life.

7. The method of claim 1, wherein a controller is coupled to the processing chamber for monitoring real-time RF related data, for comparing the real-time RF related data and for generating the alert, wherein the controller is a database with configurable software modules having sensors for monitoring the real-time RF related data.

8. The method of claim 7, wherein comparing the real-time RF related data with a pre-determined threshold RF related data comprises measuring changes in local impedance on a substrate in the processing chamber.

9. The method of claim 1, wherein monitoring real-time RF related data from plasma generated in the processing chamber further comprises:
    detecting changes in local plasma impedance with a plurality of plasma property sensors in a processing chamber.

10. The method of claim 1, wherein the real-time RF related data includes voltage peak-to-peak.

11. A non-transitory computer-readable storage medium storing a program, which, when executed by a processor performs an operation for detecting grounding strap breakage in a processing chamber, the operation comprising:
    monitoring real-time RF related data corresponding to plasma generated in the processing chamber;
    comparing the real-time RF related data with a pre-determined threshold RF related data;
    determining the real-time RF related data indicates a worn or damaged state for one or more grounding straps prior to breakage based on comparing the real-time RF related data with the pre-determined threshold RF related data; and
    generating an alert in response to determining the real-time RF related data indicates a worn or damaged state for one or more grounding straps.

12. The non-transitory computer-readable storage medium of claim 11, wherein the real-time RF related data includes RF frequency, direct current voltage, voltage peak-to-peak, and/or RF reflected power.

13. The non-transitory computer-readable storage medium of claim 11, wherein the pre-determined threshold RF related data is based on RF frequency, direct current voltage, voltage peak-to-peak, or RF reflected power reflecting one or more broken grounding straps in a process recipe matching a current process recipe.

14. The non-transitory computer-readable storage medium of claim 11, wherein the comparing the real-time RF related data comprises:
    using historical RF data to establish the pre-determined threshold RF related data for a particular process recipe for a desired product, wherein historical RF data reflects a certain number of broken grounding straps in the particular process recipe matching a current process recipe.

15. The non-transitory computer-readable storage medium of claim 1, wherein comparing the real-time RF related data with a pre-determined threshold RF related data comprises measuring changes in local impedance on a substrate in the processing chamber.

16. A plasma processing system, comprising:
   a processor;
   a plasma processing chamber, comprising:
      a plurality of chamber walls that at least partially define a processing region;
      a substrate support disposed within the processing region;
      a plurality of ground straps that each have a strap body that has a first end and a second end, wherein the first end of each of the plurality of ground straps is coupled to the substrate support and the second end of each of the plurality of ground straps is coupled to at least one of the plurality of chamber walls;
      an RF power source; and
      an RF match coupled between the RF power source and a diffuser, wherein the diffuser is adapted to generate a plasma in the process volume when RF energy is delivered to the diffuser from the RF power source, and the RF match further comprises one or more sensors that are configured to provide real-time RF related data to the processor when the RF energy is delivered from the RF power source; and
   a memory, wherein the memory includes an software routine configured to perform an operation for detecting breakage of one or more of the plurality of ground straps in a processing chamber, the operation comprising:
      monitoring real-time RF related data corresponding to plasma generated in the processing region of the processing chamber;
      comparing the real-time RF related data with a pre-determined threshold RF related data;
      determining the real-time RF related data indicates a worn or damaged state for one or more grounding straps prior to breakage based on comparing the real-time RF related data with the pre-determined threshold RF related data; and
      generating an alert in response to determining the real-time RF related data indicates a worn or damaged state for one or more grounding straps.

17. The plasma processing system of claim 16, wherein the pre-determined threshold RF related data is based on RF frequency, direct current voltage, voltage peak-to-peak, or RF reflected power reflecting one or more broken grounding straps in a process recipe matching a current process recipe.

18. The plasma processing system of claim 16, wherein the comparing the real-time RF related data comprises:
   using historical RF data for a particular recipe for a desired product to establish the pre-determined threshold RF related data, wherein historical RF data reflects a certain number of broken grounding straps in the particular process recipe matching a current process recipe.

19. The plasma processing system of claim 16, wherein comparing the real-time RF related data with a pre-determined threshold RF related data comprises measuring changes in local impedance on a substrate in the processing chamber.

20. The plasma processing system of claim 16, wherein a controller is coupled to the processing chamber for monitoring real-time RF related data, for comparing the real-time RF related data and for generating the alert, and wherein the controller is a database with configurable software modules having sensors for monitoring the real-time RF related data.

* * * * *